United States Patent [19]

Santadrea et al.

[11] Patent Number: 5,514,613
[45] Date of Patent: May 7, 1996

[54] PARALLEL MANUFACTURING OF SEMICONDUCTOR DEVICES AND THE RESULTING STRUCTURE

[75] Inventors: Joesph F. Santadrea, Los Altos Hills; Ji-Min Lee, Palo Alto; Chuen-Der Lien, Mountain View; Alan H. Huggins, Gilroy, all of Calif.

[73] Assignee: Integrated Device Technology, Santa Clara, Calif.

[21] Appl. No.: 189,024

[22] Filed: Jan. 27, 1994

[51] Int. Cl.⁶ .................................................. H01L 21/768
[52] U.S. Cl. .......................... 437/51; 437/180; 437/195; 437/209
[58] Field of Search ............................... 437/51, 180, 187, 437/204, 184, 189, 195, 209; 257/758, 734

[56] References Cited

U.S. PATENT DOCUMENTS

| | | | |
|---|---|---|---|
| 3,795,974 | 3/1974 | Calhoun | 437/180 |
| 3,835,530 | 9/1974 | Kilby | 437/180 |
| 3,861,023 | 1/1975 | Bennett | 437/184 |
| 4,067,104 | 1/1978 | Tracy | 437/187 |
| 4,295,149 | 10/1981 | Balyoz et al. | 437/51 |
| 4,709,468 | 12/1987 | Wilson | 437/209 |
| 4,778,771 | 10/1988 | Hilci | 437/204 |
| 5,192,716 | 3/1993 | Jacobs | 437/205 |

*Primary Examiner*—Tom Thomas
*Attorney, Agent, or Firm*—Skjerven, Morrill, MacPherson, Franklin & Friel; Alan H. MacPherson

[57] ABSTRACT

In accordance with this invention, integrated circuits are manufactured using parallel processing to manufacture separately selected parts of finished integrated circuits. Upon completion of the parts, the parts are joined together to form the completed integrated circuit. For example, a semiconductor wafer containing active and passive semiconductor regions is fabricated through the first layer of insulation and first conductive contacts. Separately, an interconnect structure is fabricated on a separate fabrication line to include all the layers of interconnects required to form a completed integrated circuit when joined to the wafer. The interconnect structure is joined to the wafer to form the complete integrated device. The interconnect structure can be fabricated to exclude from the integrated circuit those portions of the wafer which have been determined by test to be defective.

19 Claims, 4 Drawing Sheets

PARALLEL MANUFACTURING OF SEMICONDUCTOR DEVICES AND THE RESULTING STRUCTURE

FIELD OF THE INVENTION

This invention relates to semiconductor integrated circuits and in particular to a method of manufacturing integrated circuits which materially reduces the time required to manufacture such circuits while at the same time improving yield and performance. This invention also relates to the resulting structure.

BACKGROUND OF THE INVENTION

Integrated circuits are manufactured using a sequence of masking steps to form in a substrate (typically called a "wafer") of semiconductor material, typically silicon, a plurality of transistors, diodes and other active and passive regions together with insulation layers and interconnect layers on the surface of the wafer to interconnect the active and passive regions, transistors and diodes. As integrated circuits become more complex with hundreds of thousands if not millions of transistors on each integrated circuit, the dimensions of the active regions in the semiconductor material used to form, for example, transistors, diodes and capacitive or resistive components, shrink. As these dimensions become smaller, more devices can be placed on a given area of silicon, but the yield (i.e. the number of useful devices obtained at the end of the manufacturing process divided by the largest number of useful devices theoretically possible) drops for many reasons, such as for example, processing defects (for example particulates, film defects, and masking defects), errors in mask alignment, and unwanted impurities in the wafer. With certain complex integrated circuits, as many as 20 to 30 masking steps may be employed and as many as 3 or 4 layers of interconnects may be required in order to produce an operative integrated circuit. Each of the masking steps must be carried out correctly and each of the interconnect layers must be formed as intended to obtain a working integrated circuit. Unfortunately, as the sizes of the integrated circuits increase the yield drops thereby increasing the costs of the resulting good integrated circuits. Moreover, as the number of masking steps and interconnect layers increases the time to obtain a finished integrated circuit from the time that the manufacturing process begins increases because each of the steps carried out to fabricate the integrated circuit is carried out in sequence. Accordingly, a method to reduce the manufacturing time and cost and also to reduce the complexity of the manufacturing process required to make complex integrated circuits is desirable.

SUMMARY OF THE INVENTION

In accordance with this invention the manufacture of integrated circuits is substantially simplified by using parallel processing to manufacture selected parts of integrated circuits and upon completion of the parts, joining the parts together to form the completed integrated circuit. The method of this invention significantly reduces the time required to manufacture a completed integrated circuit because it allows the manufacture in parallel of the components of the integrated circuit. Alternatively, the components of the integrated circuit can be fabricated and stored in inventory to be used when required to form the completed integrated circuit.

In one embodiment of this invention, a semiconductor wafer is fabricated to include the first layer of insulation and conductive contacts to the active and passive semiconductor regions within the wafer which will be used in the finished integrated circuits. Simultaneously or separately an interconnect structure is fabricated on a separate fabrication line to include some or all of the layers of interconnects and associated insulating layers required to form a completed integrated circuit when joined to the wafer.

Typically the wafer will contain a plurality of semiconductor dice each die containing the identical circuit.

In accordance with one embodiment of this invention, the joining of the interconnect structure to the wafer is done prior to separation of the dice from the wafer. Alternatively, in another embodiment of this invention, the wafer can be first separated into dice and an interconnect structure associated with each die can then be joined to that die on a die-by-die basis.

In another embodiment of the invention, wafer scale integration is possible wherein the interconnect structure can be programmed to reflect the results of tests on the wafer to exclude from the integrated circuit those portions of the wafer which have been determined to be defective. This invention makes possible wafer scale integration on an economic and practical basis.

Furthermore, in accordance with another embodiment of this invention, the interconnect structure associated with a given die can be made in accordance with more tolerant design rules than used to make the semiconductor portion of the integrated circuit thereby greatly reducing the cost associated with the fabrication of the completed integrated circuit.

This invention will be more fully understood in accordance with the following detailed description taken together with the drawings.

DETAILED DESCRIPTION

The following detailed description is meant to be illustrative only and not limiting. Other embodiments of this invention will be obvious in view of this disclosure.

Figure 1:
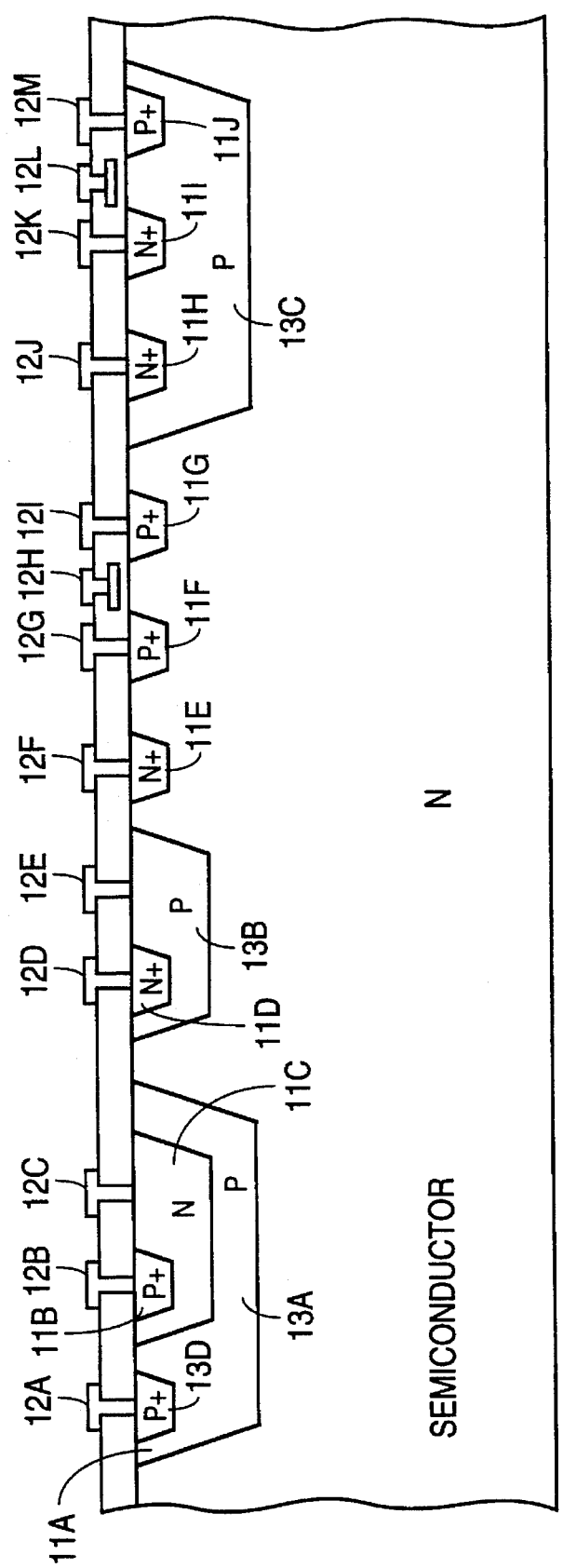
FIG. 1 shows a wafer containing active and passive semiconductor regions formed therein as they would appear just prior to the formation of the interconnect structure on the wafer to form a completed integrated circuit.

As shown in FIG. 1, wafer 10 has a plurality of active and passive regions (such as regions 11A to 11J and 13A to 13D) formed in the semiconductor material (typically but not necessarily silicon) using standard semiconductor processing techniques. Active regions 11A, 11B, and 11C might, for example, comprise the collector, emitter and base of a bipolar transistor while active regions 11D and 11E might, for example, comprise the source and drain of an MOS transistor. While normally bipolar and MOS transistors are not mixed on the same wafer these regions are shown for the purpose of illustrating the broad applicability of this invention to cover both bipolar and MOS as well as biCMOS types of circuitry. In addition, regions 11F and 11G are shown as comprising resistive paths within the wafer for inclusion in the circuitry to be formed from the wafer. Naturally an integrated circuit would contain hundreds of thousands if not millions of such active and passive regions formed to provide the desired transistor, diode, capacitor and resistor structure necessary to form the intended integrated circuit.

In normal processing, wafer 10 is fabricated by first taking a blank wafer which meets the semiconductor manufacturer's incoming wafer specifications and then forming a number of masking and insulation layers on the wafer to be used to form the desired active and passive regions of semiconductor material within the wafer. These active and passive regions are typically formed using ion implantation techniques and/or trench isolation techniques well known to the industry. These techniques will not be described in detail. Once all of the active and passive regions have been formed in the wafer, the wafer is ready for the formation of the interconnect structure on the top of the wafer. Typically, the interconnect layers are then formed in sequence using standard processes known in the industry. For example, the surface of the wafer is either thermally oxidized or has deposited upon it a layer of insulation. This layer of insulation is then masked to form vias to the underlying active regions and an interconnect material is then formed on the surface of the composite structure above both the insulation and the portions of the surfaces of the active regions exposed by the vias. The interconnect layer is then masked and patterned to form the desired first interconnect structure.

A second layer of insulation is then formed over the first interconnect structure to electrically isolate the first interconnect structure from subsequent interconnect layers to be formed on the wafer. Following the formation of the second insulation layer, the second insulation layer is masked and vias are then formed through the second insulation layer to expose portions of the first interconnect structure and perhaps even portions of the underlying wafer if desired. A second interconnect layer is then formed on the wafer and this second interconnect layer is then masked so as to define the pattern of the second interconnect structure to be formed on the wafer. This sequential process continues until the desired number of interconnect layers have been formed on the wafer and contact pads for connecting the electrical circuitry within the wafer to the outside world have been formed on the top surface of the wafer. The wafer is then scribed and broken into separate integrated circuit dice and then packaged in accordance with well known standard techniques in the industry.

In accordance with this invention, manufacture of integrated circuits uses parallel processing to manufacture selected parts of finished integrated circuits. Upon completion of the parts, the parts are joined together to form the completed integrated circuit. In one embodiment of this invention, the first layer of insulation and the first interconnect layer can be separately fabricated simultaneously with the fabrication of the wafer or even prior to the fabrication of the wafer and held in inventory until the wafer is completed. Then the interconnect structure is connected to the wafer using either standard bonding techniques available in the industry or using a combination of standard bonding techniques and alignment techniques together with passivating glass or other insulative material to form a tight bond between the interconnect structure and the underling wafer.

In accordance with one embodiment of this invention, semiconductor processing of wafer 10 (FIG. 1) is terminated after formation of conductive contacts 12A to 12M to active and passive semiconductor regions (11A to 11J and 13A and 13D) of wafer 10 which are intended to be contacted by the first interconnect layer. The interconnect layers for wafer 10 are formed as part of a separate interconnect structure as described below. In accordance with another embodiment of this invention some of the interconnect layers of an integrated device are formed by semiconductor processing on wafer 10 while the rest of the interconnect layers are formed as part of the separate interconnect structure.

Figure 2A:
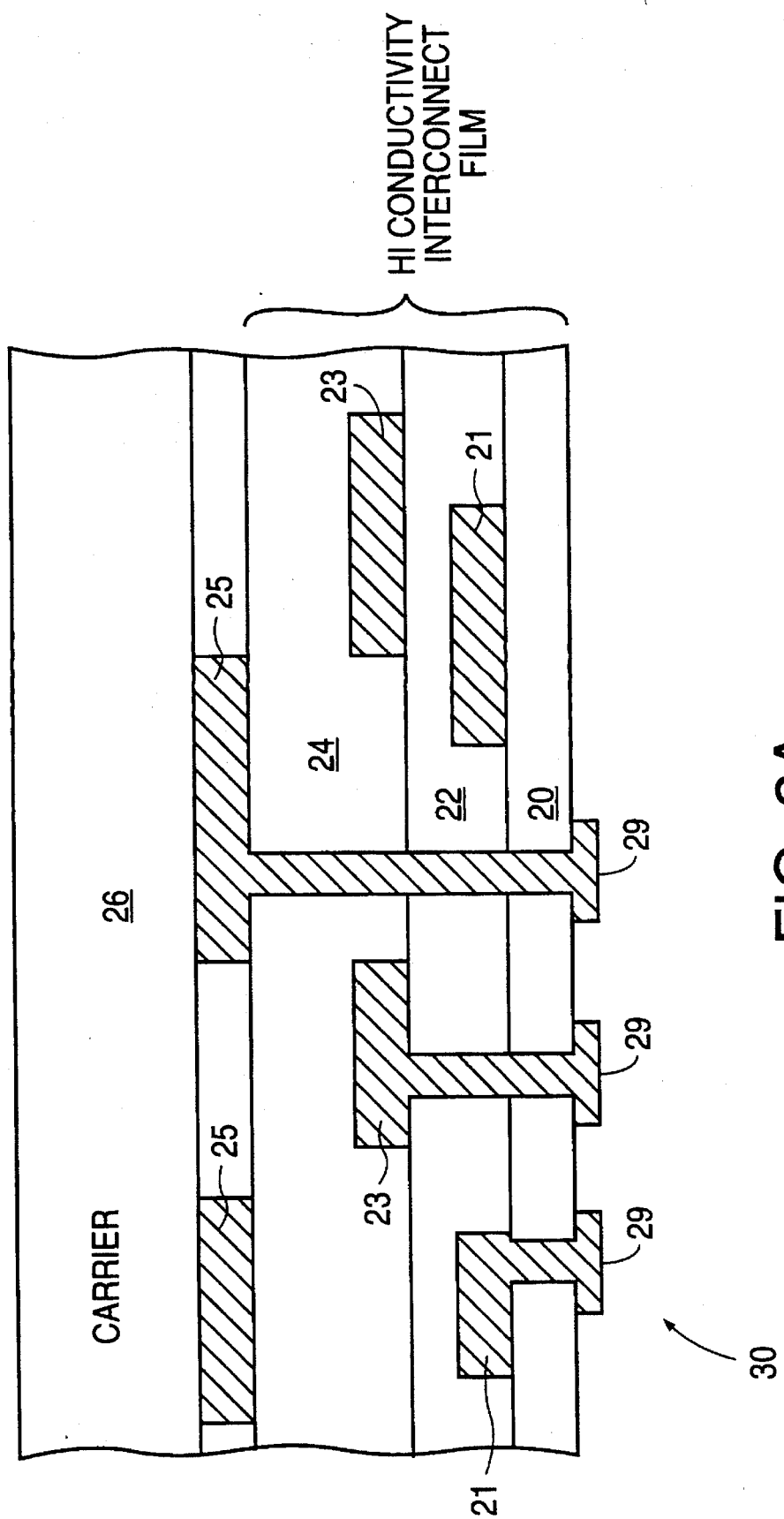
FIG. 2A shows an enlarged view of a portion of the interconnect structure appropriate for use on a portion of the wafer of FIG. 1 and in particular shows the structural relationship of the various insulation and interconnect layers in one possible interconnect structure appropriate for use with the wafer of FIG. 1.

FIG. 2A illustrates a portion of an interconnect structure in enlarged view of a type suitable for use with this invention. As shown in FIG. 2A a first interconnect layer 21 is formed on top of insulation 20. Insulation 20 can be any of several well known insulating materials including glass such as silicon dioxide. The first interconnect layer 21 typically will be fabricated of an electrically conductive material such as any metal or alloy including aluminum, copper, titanium tungsten, silicides, or even polycrystalline silicon selectively doped. Following the fabrication (including patterning) of the first interconnect layer 21 (portions of which may extend completely through vias in insulation 20), a second layer of insulation 22, typically silicon dioxide or some other acceptable glass such as a mixture of silicon and germanium oxides, is formed over the first interconnect layer 21. This glass is masked using standard photolithographic techniques and vias are formed through this glass to the first interconnect layer. A second interconnect layer 23 is then formed on glass layer 22. Second interconnect layer 23 is then patterned to form the desired interconnection pattern. Again, second interconnect layer 23 can be any suitable material such as aluminum, copper, or a high-temperature-resistive material such as a metal silicide or a polycrystalline silicon doped layer. Following the formation of patterned interconnect layer 23 another insulating layer 24 of a selected material which, for example, might be an oxide of silicon or silicon nitride or even a polyimide or ceramic material, is formed on layer 23. Yet another (a third) interconnect layer 25 can be formed and patterned on insulating layer 24 to form the desired interconnect pattern. A carrier 26 is then formed on the resulting interconnect structure containing three patterned interconnect layers.

As shown in FIG. 2A the interconnect structure 30 thus contains all of the components that would normally be expected in a three-interconnect-layer integrated circuit interconnect structure but is fabricated separately from the underlying wafer. Typically in the fabrication of the interconnect structure 30 shown in FIG. 2A, the structure can be initially formed on an underlying carrier (not shown in FIG. 2A) of selected material, even silicon, which later can be etched away or otherwise removed by any of several well-known processes such as, for example, dry plasma etch or chemical-mechanical polish thereby to leave the interconnect structure 30 in a form as shown suitable for use with wafer 10. The initial carrier which is a sacrificial substrate can also be alumina $Al_2O_3$ or any other suitable ceramic material. The carrier is etched away or otherwise removed to expose the bottom surface of the interconnect structure 30 prior to the use of the interconnect structure 30 in its intended role on a finished interconnected integrated circuit. In accordance with this invention, the top carrier 26 shown in FIG. 2A can be removed either prior to or subsequent to the interconnect structure 30 being joined to the wafer 10.

Also, in accordance with this invention, the interconnect structure 30 can be formed top down with the carrier 26 being formed first and then the layers of interconnect patterns being formed in reverse order to the order in which they would be formed if fabricated on wafer 10 in sequence as in the prior art. Alternatively, the interconnect structure 30 can be formed bottom up with the layers of interconnect patterns being formed first on a sacrificial carrier (not shown) and the carrier 26 being formed in the end.

Figure 2B:
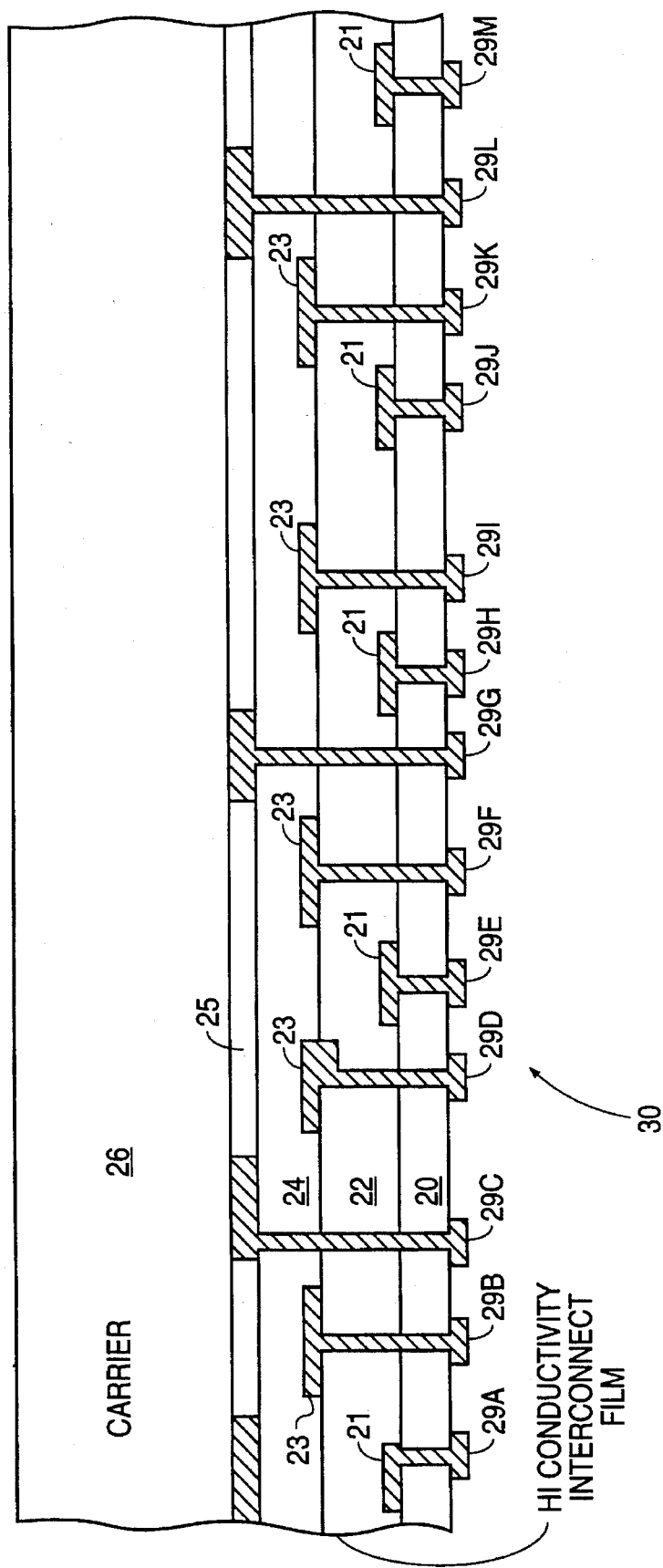
FIG. 2B shows a portion of the interconnect structure of FIG. 2A as a unitary whole.

FIG. 2B shows a larger portion of the interconnect structure of FIG. 2A.

Figure 3:
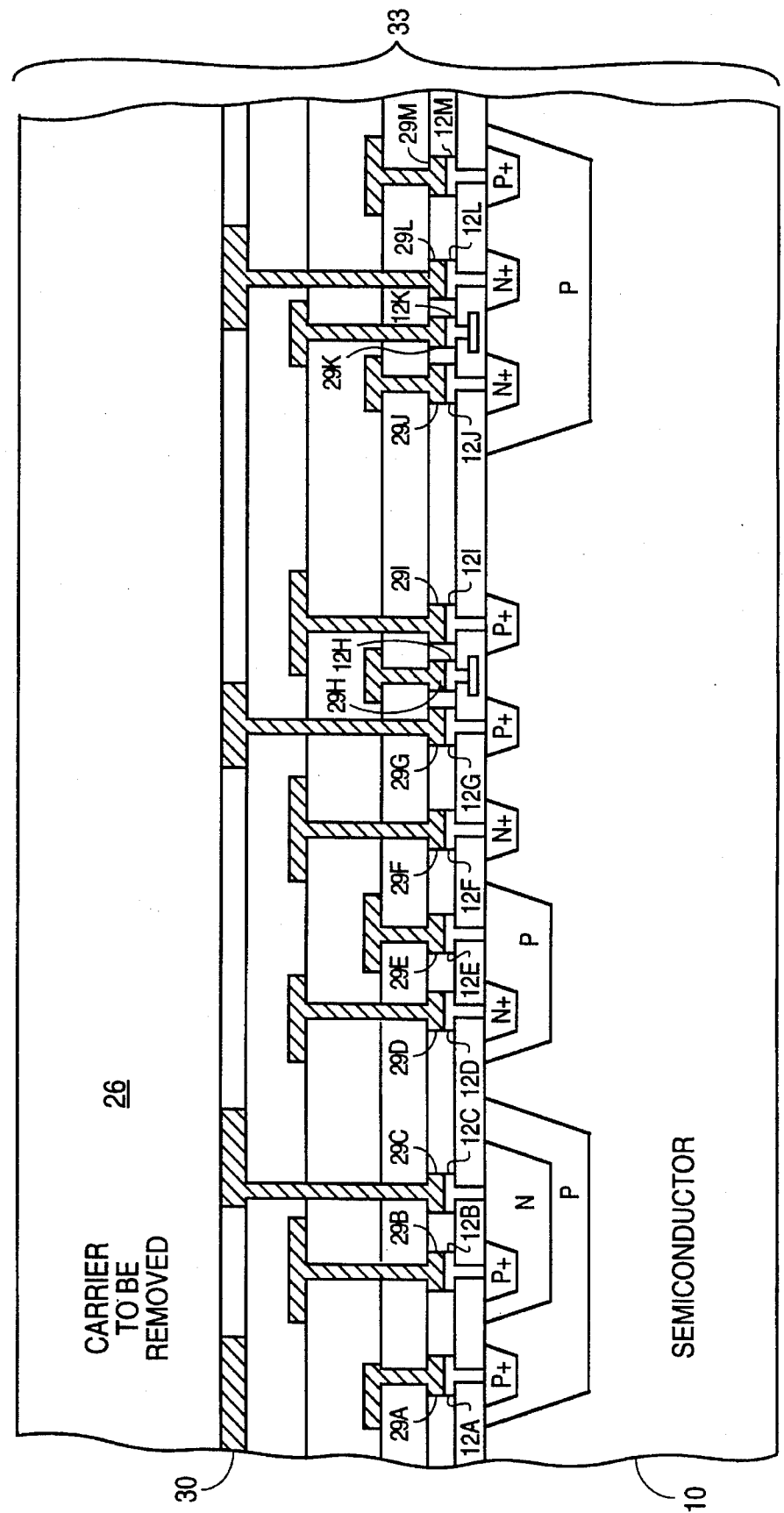
FIG. 3 shows a completed integrated circuit manufactured in accordance with the principles of this invention wherein the interconnect structure of FIG. 2B has been joined to the wafer of FIG. 1 to form a complete integrated circuit.
Figure 2B:
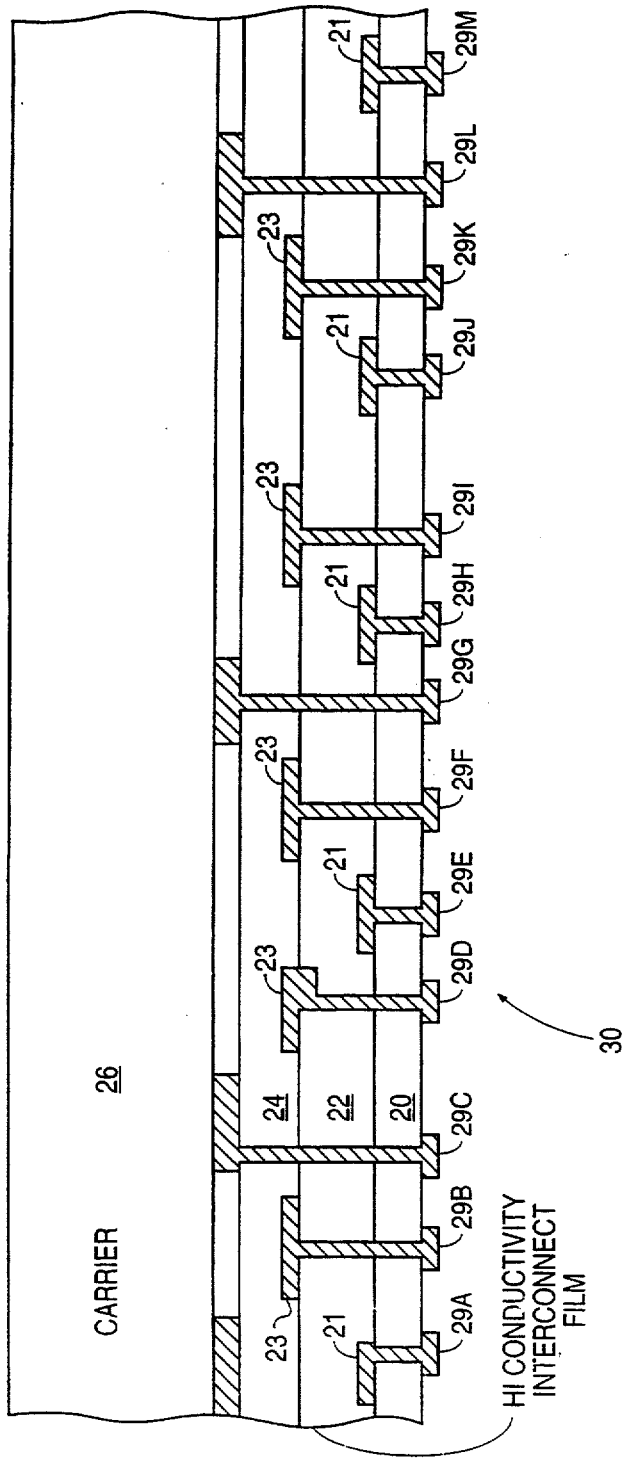

FIG. 3 illustrates wafer 10 of FIG. 1 combined with the interconnect structure 30 of FIG. 2B to form the finished unpackaged integrated circuit. For simplicity many numbers on the structures of FIGS. 1 and 2B are omitted in FIG. 3. The interconnect structure 30 has been joined to wafer 10 by placing contacts 29A to 29M of interconnects directly adjacent and in electrical contact with conductive contacts 12A to 12M to active and passive semiconductor regions of wafer 10 intended to be contacted by the interconnect structure 30 and then heating the composite structure 33 to a selected temperature for a selected time to form a desired unitary bond between the wafer 10 and the interconnect structure 30. In one embodiment, when the interconnect structure 30 contains aluminum the heat treatment must be less than the temperature at which the aluminum will melt (i.e. less than approximately 550° C.). When, however, the interconnect structure 30 is formed using interconnect materials capable of resisting high temperatures, then the heating of the composite structure to join interconnect structure 30 to wafer 10 can take place at higher temperatures.

Although in one embodiment of this invention, the interconnect structure 30 and the semiconductor wafer 10 are in intimate contact with each other so that the interconnect structure and the semiconductor wafer are mechanically bonded, in another embodiment of this invention, a layer of selected gas, typically inert, is present between the adjacent surfaces of the interconnect structure 30 and the semiconductor wafer 10 except at the conductive contacts 29A to 29M to the active and passive semiconductor regions 11A to 11J and 13A to 13D within the wafer 10. In one embodiment of this invention, the thickness of the layer of gas is greater than or equal to 2000 angstroms. One advantage of a layer of gas is that capacitance is reduced due to isolation provided by the gas layer so that the RC effects of the interconnect structure 30 have minimal impact on the components in the semiconductor material 10.

In one embodiment in accordance with this invention, the interconnect structure is joined to the wafer using solder balls of 1.5 micron size formed using conventional processes.

One of the advantages of the invention is that interconnect structure 30 can be fabricated in accordance with design rules which are more tolerant and easier to implement than the design rules used to fabricated the underlying wafer 10. This results in a decrease in the cost of manufacture of the resulting integrated circuit and an increase in the yield. Interestingly, the use of a different set of design rules for the manufacture of the integrated circuit interconnect structure 30 as opposed to the wafer 10 does not deleteriously affect the performance of the wafer 10 because important critical parameters such as the RC loading sensed by the drive transistors on the wafer can be lowered, by increasing the thickness of the insulation and decreasing the resistance of the interconnect material. Thus the RC loading seen by the drive transistors of the wafer 10 can be made equal to or less than the RC loading present in current integrated circuits while at the same time using less strict design rules for fabrication of the interconnect structure 30 than those associated with the integrated circuit wafer 10. The resistances of interconnects can be decreased by choosing the material, width and thickness of the conducting layers of the interconnect structure independently of the wafer's process parameters.

Among the advantages of this invention are not only the improved yield and the possibility of use of less strict design rules to make the interconnect structure but in addition the flexibility of the materials that can be used for the interconnect structure. In accordance with this invention, process limitations in manufacturing one group of layers do not affect another group's processes, so that limitations on the kinds of materials and process parameters (such as silicon contamination) do not have the significant impact that is common for conventional processes. This leads to lower costs as well as higher performance in the finished integrated circuit. For example, the use of less strict design rules and alternative materials to fabricate the interconnect structure 30 allow the use of alternative lower cost processes in the fabrication of the interconnect structure than heretofore were available. For example, plating can be used to form interconnect layers whereas in normal integrated circuit production plating is not commonly thought to be suitable for such use. Therefore, materials used in forming the conducting layer of an interconnect structure are not limited by conventional metallization schemes of very large scale integrated circuit (VLSI) processing. In one embodiment, the conducting layers of the interconnect structure are formed of metals and alloys such as for example, copper, gold and tungsten.

Another advantage of this invention is that there are no substantial process limitations on the size of an integrated device because several groups of layers can be built independently in parallel and the groups can be joined together in the end to build the final integrated device. Therefore the device size can be very large and include many more interconnect layers than heretofore thought possible without having an adverse impact on the yield. Furthermore, because a number of sub-groups of layers can be built in parallel, the manufacturing cycle time is significantly improved.

In accordance with this invention, a wafer, containing for example gate arrays, can be manufactured and stored in inventory independent of receipt of customer orders and manufacture of custom layers. Custom layers can be manufactured after receipt of a customer order and joined to the wafer to get the final product.

One of the difficulties associated with manufacturing integrated circuits is testing the integrated circuit at various stages in production to determine whether or not the intermediate structure has defects which should either be corrected or which result in scrapping of the product at that point. Naturally, it is important to detect defects as soon as possible to avoid adding value to what will ultimately be a defective product. Failure to detect such defects at the earliest possible stage of production increases the cost of the finished product.

In accordance with this invention, the wafer and the interconnect structure will each be individually optically inspected by optical inspection equipment of well-known design and the resulting images will be compared to a database in a computer automatically by the inspection equipment. Should the images not be consistent with the database, then the computer will automatically indicate a problem and the problem can then be either corrected or the product discarded. Such optical inspection can be carried out at every stage, at every alternate stage or at some desirable intermediate stage in production of the wafer and in production of the interconnect structure. Although optical inspection is described above, any inspection technique, such as for example, electrical inspection of the wafer and/or the interconnect structure can be used in accordance with this invention.

In accordance with this invention, the joining of the interconnect structure to the wafer is done prior to separation of the dice from the wafer. Alternatively, the wafer can be first separated into dice and an interconnect substructure associated with each die can then be joined to that die on a die-by-die basis. The interconnect substructure can be either formed initially as a single interconnect structure that is separated into a plurality of interconnect substructures or alternatively each interconnect substructure can be formed independently and separately of other interconnect substructures.

In another embodiment of the invention, various dice are joined to a single interconnect structure. The dice can be unfinished components of a commercial integrated circuit device or alternatively, the dice can themselves be finished commercially available dice. In one embodiment in accordance with this invention, a single microprocessor with onboard cache memory can be formed from a microprocessor die and a random access memory die joined to a single interconnect structure.

In another embodiment of the invention wafer scale integration is possible wherein the interconnect structure can be programmed to reflect the test results of the wafer to exclude from the integrated circuit those portions of the wafer which have been determined to be defective. This invention makes possible wafer scale integration on an economic and practical basis.

While certain embodiments of this invention are described above, other embodiments of this invention will be obvious in view of this disclosure.

What is claimed is:

1. A method of manufacturing an integrated circuit comprising the steps of:
   (i) forming a first part of the integrated circuit in a semiconductor substrate, said first part having a top surface and having contacts on the top surface;
   (ii) separately forming an interconnect structure for use with the semiconductor substrate, said interconnect structure comprising one or more interconnect layers, said interconnect structure having a bottom surface and a top surface opposite the bottom surface, one of said interconnect layers being on the top surface of the interconnect structure, said interconnect structure further comprising contacts on the bottom surface at locations corresponding to the locations of the contacts on the top surface of the first part of the integrated circuit; and
   (iii) joining the interconnect structure fabricated in (ii) to the semiconductor substrate fabricated in (i) to form the integrated circuit, said joining step including joining the contacts on the bottom surface of the interconnect structure to the contacts on the top surface of the first part of the integrated circuit so that the top surface of the interconnect structure becomes the top surface of the integrated circuit and said one interconnect layer is on the top surface of the integrated circuit and is connected by electrically conductive material to the first part of the integrated circuit.

2. The method of claim 1 wherein separately forming the interconnect structure for use with the semiconductor substrate includes forming an interconnect structure using a different set of design rules from the design rules used to fabricate the semiconductor substrate.

3. The method of claim 2 wherein separately forming the interconnect structure includes selectively plating one or more of the components of the interconnect structure.

4. The method of claim 2 wherein separately forming the interconnect structure includes forming an electrically conductive layer using a material selected from a group consisting of gold, chromium and copper.

5. The method of claim 2 wherein separately forming the interconnect structure includes forming an electrically conductive layer using a material different from those used to form a conductive layer in a semiconductor substrate.

6. The method of claim 2 wherein joining the interconnect structure to the semiconductor substrate comprises:
   placing the interconnect structure in contact with the semiconductor substrate; and
   heating the composite structure to form an integral bond between the interconnect structure and the semiconductor substrate.

7. The method of claim 1 further comprising optically inspecting each layer of said semiconductor substrate.

8. The method of claim 1 further comprising electrically inspecting each layer of said semiconductor substrate.

9. The method of claim 1 wherein the first part of the integrated circuit includes an interconnect layer.

10. A method of manufacturing an integrated circuit comprising the steps of:
    (i) forming a plurality of first parts of integrated circuits in a semiconductor substrate;
    (ii) separately forming an interconnect structure;
    (iii) forming a plurality of dice from said semiconductor substrate, each of said dice comprising one of said first parts, said one of said first parts having a top surface and having contacts on said top surface;
    (iv) forming a plurality of interconnect substructures from said interconnect structure for use with said dice, each interconnect substructure being a second integrated circuit part, each interconnect substructure comprising one or more interconnect layers, each interconnect substructure having a bottom surface and a top surface opposite the bottom surface, one of said interconnect layers being on the top surface of each interconnect substructure, each interconnect substructure further comprising contacts on the bottom surface at locations corresponding to the locations of the contacts on said one of said first parts; and
    (V) joining one of said plurality of interconnect substructures to a corresponding one of said plurality of dice to form the integrated circuit, said joining step including joining the contacts on the bottom surface of said one interconnect substructure to the contacts on the top surface of said one of said first parts so that the top surface of the interconnect substructure becomes the top surface of the integrated circuit and said one interconnect layer is on the top surface of the integrated circuit and is connected by electrically conductive material to said one of said first parts.

11. The method of claim 10 wherein the first parts of integrated circuits each include an interconnect layer.

12. A method of manufacturing an integrated circuit comprising the steps of:
    (i) forming a plurality of first parts of integrated circuits in a semiconductor substrate;

(ii) forming a plurality of dice from said semiconductor substrate, each of said dice including one of said first parts, said one of said first parts having a top surface and having contacts on said top surface;

(iii) separately forming a second part of the integrated circuit comprising an interconnect structure comprising one or more interconnect layers, said interconnect structure having a bottom surface and a top surface opposite the bottom surface, one of said interconnect layers being on the top surface of the interconnect structure, said interconnect structure further comprising contacts on the bottom surface at locations corresponding to the locations of the contacts on said one of said parts; and (iv) joining said interconnect structure to one of said plurality of dice to form the integrated circuit, said joining step including joining the contacts on the bottom surface of the interconnect structure to the contacts on the top surface of said one of said first parts so that the top surface of the interconnect structure becomes the top surface of the integrated circuit and said one interconnect layer is on the top surface of the integrated circuit and is connected by electrically conductive material to said one of said first parts.

13. The method of claim 12 wherein the first parts of integrated circuits each include an interconnect layer.

14. A method of manufacturing an integrated circuit comprising the steps of:

(i) forming a first part of the integrated circuit in a semiconductor substrate, said first part comprising a plurality of dice, each of said dice having a top surface and having contacts on said top surface;

(ii) inspecting said semiconductor substrate for good dice;

(iii) separately forming a second part of the integrated circuit comprising an interconnect structure, comprising one or more interconnect layers, for use with the semiconductor substrate, said interconnect structure having a bottom surface and a top surface opposite the bottom surface, one of said interconnect layers being on the top surface of the interconnect structure;

(iv) fabricating said interconnect structure to mate only with said good dice, the contacts on the bottom surface of the interconnect structure corresponding to the contacts on said good dice; and (v) joining said interconnect structure to said semiconductor substrate to form the integrated circuit, said joining step including joining the contacts on the interconnect structure to the contacts on said good dice so that the top surface of the interconnect structure becomes the top surface of the integrated circuit and so that said one interconnect layer is on the top surface of the integrated circuit and is electrically connected to said good dice.

15. The method of claim 14 wherein said inspection comprises optically inspecting each layer of said semiconductor substrate.

16. The method of claim 14 wherein said inspection comprises electrically inspecting each layer of said semiconductor substrate.

17. The method of claim 14 wherein the first part of the integrated circuit includes an interconnect layer.

18. A method of manufacturing an integrated circuit comprising the steps of:

(i) forming a plurality of semiconductor dice, each die containing part of an integrated circuit, each die having a top surface and having contacts on said top surface;

(ii) separately forming an interconnect structure containing a plurality of interconnect substructures for use with said plurality of semiconductor dice, each interconnect substructure comprising one or more interconnect layers, each interconnect substructure having a bottom surface and a top surface opposite the bottom surface, one of said interconnect layers being on the top surface of each interconnect substructure, each interconnect substructure further comprising contacts on the bottom surface at locations corresponding to the locations of the contacts on the top surface of one of said plurality of dice;

(iii) inspecting said interconnect structure for good interconnect substructures;

(iv) removing from said interconnect structure said good interconnect substructures; and (v) joining one of said good interconnect substructures to one of said semiconductor dice to form the integrated circuit, said joining step including joining the contacts on the bottom surface of said one good interconnect substructure to the contacts on said one semiconductor die so that the top surface of the interconnect substructure becomes the top surface of the integrated circuit and said one interconnect layer is on the top surface of the integrated circuit and is connected by electrically conductive material to said one semiconductor die.

19. The method of claim 18 wherein at least one of the plurality of dice contains an interconnect layer.

\* \* \* \* \*

UNITED STATES PATENT AND TRADEMARK OFFICE
CERTIFICATE OF CORRECTION

PATENT NO. : 5,514,613
DATED : May 7, 1996
INVENTOR(S) : Joseph F. Santandrea, Ji-Min Lee, Chuen-Der Lien and Alan H. Huggins It is certified that error appears in the above-identified patent and that said Letters Patent is hereby corrected as shown below:

Please delete the number "25" from FIG. 2B so that FIG. 2B is as attached.

Signed and Sealed this

Twenty-third Day of July, 1996

Attest:

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,514,613
DATED : May 7, 1996
INVENTOR(S) : Santandrea, et al.

It is certified that error appears in the above—identified patent and that said Letters Patent is hereby corrected as shown below:

On the cover page of the above-identified patent:

Section [19], change "SANTADREA" to "SANTANDREA".

Section [75], change "Santadrea" to -- Santandrea --.

Signed and Sealed this

Twenty-second Day of October, 1996

Attest:

BRUCE LEHMAN

Attesting Officer     Commissioner of Patents and Trademarks